United States Patent
Kondo et al.

(10) Patent No.: US 10,026,650 B2
(45) Date of Patent: *Jul. 17, 2018

(54) RESIN COMPOSITION, RESIN FILM, SEMICONDUCTOR DEVICE AND METHOD OF MANUFACTURE THEREOF

(71) Applicant: SHIN-ETSU CHEMICAL CO., LTD., Tokyo (JP)

(72) Inventors: Kazunori Kondo, Annaka (JP); Yoichiro Ichioka, Annaka (JP); Hideto Kato, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/136,551

(22) Filed: Apr. 22, 2016

(65) Prior Publication Data

US 2016/0315025 A1    Oct. 27, 2016

(30) Foreign Application Priority Data

Apr. 24, 2015    (JP) .................................. 2015-089470

(51) Int. Cl.
    *C08L 83/04*      (2006.01)
    *H01L 21/78*     (2006.01)
    (Continued)

(52) U.S. Cl.
    CPC .............. *H01L 21/78* (2013.01); *C08G 59/02* (2013.01); *C08G 59/3281* (2013.01);
    (Continued)

(58) Field of Classification Search
    CPC .......... C08L 83/04; C08L 83/06; C08L 83/14; C08K 3/36
    See application file for complete search history.

(56) References Cited

U.S. PATENT DOCUMENTS 6,147,169 A * 11/2000 Ohnishi .................. C08G 59/18
                                                                525/403
7,495,060 B2 * 2/2009 Suzuki .................. C08G 59/621
                                                                525/423
(Continued)

FOREIGN PATENT DOCUMENTS

JP    2012-246461 A    12/2012
JP    2014-131004 A     7/2014
(Continued)

OTHER PUBLICATIONS

Thomson Scientific, London, GB; AN 2014-R74009 XP002761489 (2 pages).

Search Report dated Oct. 11, 2016, issued in counterpart European Application No. 16166672.2 (5 pages).
Office Action dated Jan. 23, 2018, issued in counterpart Japanese Application No. 2015-089470, with English machine translation. (6 pages).

*Primary Examiner* — Margaret G Moore
(74) *Attorney, Agent, or Firm* — Westerman, Hattori, Daniels & Adrian, LLP

(57) ABSTRACT

A film-forming resin composition for use in encapsulating large-diameter thin-film wafers includes (A) a silicone resin having a weight-average molecular weight of 3,000 to 500,000 and containing repeating units of formula (1)

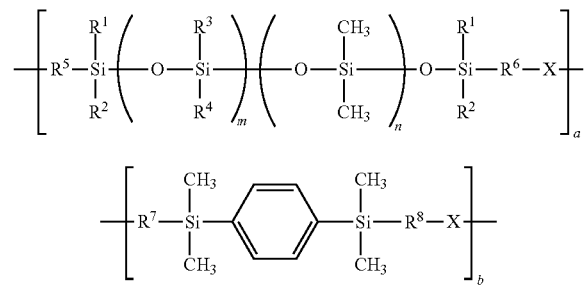

wherein $R^1$ to $R^4$ are monovalent hydrocarbon groups, but $R^3$ and $R^4$ are not both methyl, m and n are integers of 0 to 300, $R^5$ to $R^8$ are divalent hydrocarbon groups, a and b are positive numbers such that a+b=1, and X is a specific divalent organic moiety; (B) a phenolic compound of formula (7)

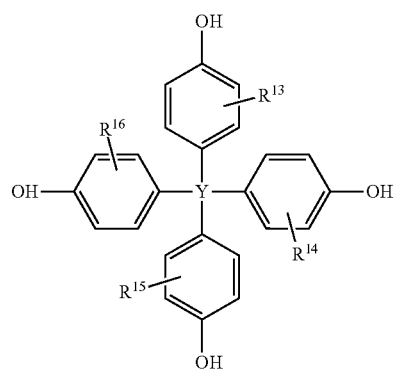

wherein Y is a carbon atom or a tetravalent hydrocarbon group of 2 to 20 carbon atoms, and $R^{13}$ to $R^{16}$ are monovalent hydrocarbon groups or hydrogen atoms; and (C) a filler.

12 Claims, No Drawings

(51) Int. Cl.
  *C08K 3/36* (2006.01)
  *C08L 83/06* (2006.01)
  *C08K 5/13* (2006.01)
  *H01L 23/29* (2006.01)
  *C08G 59/02* (2006.01)
  *C08G 59/32* (2006.01)
  *C08G 59/50* (2006.01)
  *C08G 59/62* (2006.01)
  *C08K 3/013* (2018.01)
  *C08L 63/00* (2006.01)
  *C08L 83/14* (2006.01)

(52) U.S. Cl.
  CPC ....... *C08G 59/5073* (2013.01); *C08G 59/621* (2013.01); *C08K 3/013* (2018.01); *C08K 3/36* (2013.01); *C08K 5/13* (2013.01); *C08L 83/04* (2013.01); *C08L 83/06* (2013.01); *H01L 23/296* (2013.01); *C08L 63/00* (2013.01); *C08L 83/14* (2013.01); *C08L 2201/08* (2013.01); *C08L 2203/206* (2013.01)

(56) References Cited

U.S. PATENT DOCUMENTS

| | | | |
|---|---|---|---|
| 2012/0108762 A1* | 5/2012 | Kondo | C08G 77/14 525/476 |
| 2012/0196991 A1* | 8/2012 | Ono | C08G 59/4014 525/529 |
| 2014/0154868 A1 | 6/2014 | Sugo et al. | |
| 2014/0342530 A1 | 11/2014 | Yasuda et al. | |

FOREIGN PATENT DOCUMENTS

| | | |
|---|---|---|
| JP | 2014-185282 A | 10/2014 |
| JP | 2014-241399 A | 12/2014 |
| WO | 2009/142065 A1 | 11/2009 |

* cited by examiner

RESIN COMPOSITION, RESIN FILM, SEMICONDUCTOR DEVICE AND METHOD OF MANUFACTURE THEREOF

CROSS-REFERENCE TO RELATED APPLICATION

This non-provisional application claims priority under 35 U.S.C. § 119(a) on Patent Application No. 2015-089470 filed in Japan on Apr. 24, 2015, the entire contents of which are hereby incorporated by reference.

TECHNICAL FIELD

This invention relates to a resin composition, a resin film, and a semiconductive device and method of manufacture thereof.

BACKGROUND ART

The recent and ongoing transition in the dimensions of wafers used in semiconductor device fabrication toward larger diameters and smaller thicknesses has created a need for technology to seal such wafers at the wafer level. In addition to conventional transfer molding processes carried out with solid epoxy resins, International Application WO 2009/142065 discloses a compression molding process that uses a liquid epoxy resin.

However, in transfer molding, the resin is forced through tight areas, which may cause wire deformation. Also, poor filling is more likely to arise as the surface area to be sealed increases. As for compression molding, the difficulty of precisely controlling the molding range at the wafer edge is compounded by the challenge of optimizing the flowability and physical properties of the liquid encapsulating resin when poured into the molding machine. In addition, the transition toward wafers of larger diameter and smaller thickness has given rise to an entirely new concern—wafer warpage after molding, and so good wafer protection is also required.

CITATION LIST

Patent Document 1: WO 2009/142065

DISCLOSURE OF INVENTION

For the above reasons, there has existed a desire recently for the development of a wafer encapsulating material which is capable of collectively encapsulating a wafer without causing problems such as poor filling onto the wafer surface, and which, after encapsulation, has a good adhesion to the wafer, minimizes warpage and provides good wafer protection.

It is therefore an object of this invention to provide a resin composition and resin film which is capable of collectively encapsulating a wafer (wafer level encapsulation), having in particular good encapsulation properties for use on large-diameter thin-film wafers, which at the same time minimizes warpage and provides good wafer protection after encapsulation, and which moreover enables the encapsulating operation to be efficiently carried out and is suitable for use in wafer-level packaging. Further objects of the invention include providing a semiconductor device encapsulated with such a resin film, and a method for manufacturing such a semiconductor device.

As a result of extensive investigations, the inventors have discovered that a resin composition having excellent adhesion to the wafer and minimal warpage after curing can be provided by combining (A) the silicone resin described below and (B) a phenolic compound having a specific structure. In addition, because the filler (C) described below enhances wafer protection and reliability of the resin composition after curing, the inventors have found that a resin film obtained from a resin composition comprising these components serves as a wafer encapsulating material which provides both good adhesion to the wafer and good wafer protection.

Accordingly, in one aspect, the invention provides a resin composition comprising:

(A) a silicone resin having a weight-average molecular weight of 3,000 to 500,000 and containing repeating units of formula (1) below

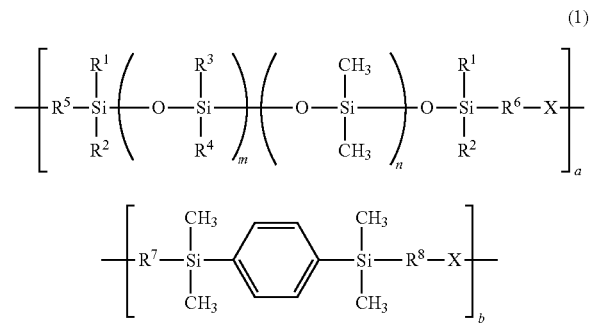

wherein $R^1$ to $R^4$ are each independently a monovalent hydrocarbon group of 1 to 8 carbon atoms, with the proviso that $R^3$ and $R^4$ are not both methyl, m and n are each independently an integer of 0 to 300, $R^5$ to $R^8$, which may be the same or different, are each a divalent hydrocarbon group of 1 to 10 carbon atoms, a and b are both positive numbers such that a+b=1, and X is a divalent organic moiety of general formula (2) below

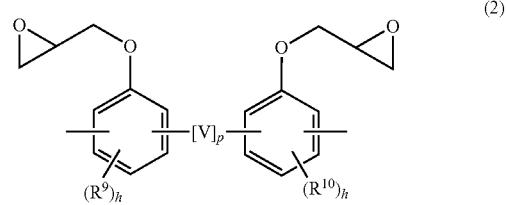

wherein V is a divalent organic group selected from the following:

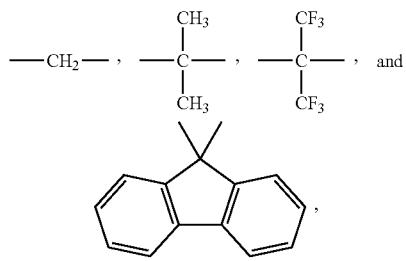

p is 0 or 1, $R^9$ and $R^{10}$ are each an alkyl or alkoxy group of 1 to 4 carbons atoms and may be the same or different, and h is 0, 1 or 2;

(B) a phenolic compound of general formula (7) below

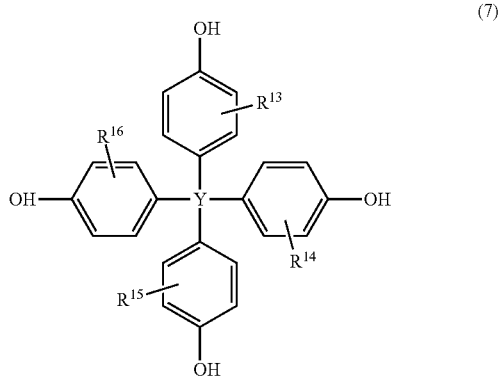

(7)

wherein Y is a carbon atom or a tetravalent hydrocarbon group of 2 to 20 carbon atoms, and $R^{13}$ to $R^{16}$ are each independently a monovalent hydrocarbon group of 1 to 8 carbon atoms or a hydrogen atom; and (C) a filler.

Such a resin composition can be formed into a film, and thus is capable of collectively encapsulating a wafer (wafer level encapsulation). Moreover, when used for encapsulating large-diameter thin-film wafers, this composition has a good encapsulating ability and adhesion, minimizes warpage, and has excellent wafer protection and reliability. Such a resin composition is thus well-suited for use in wafer-level packaging.

In a preferred embodiment, component (B) is included in an amount of 5 to 50 parts by weight per 100 parts by weight of component (A), and component (C) is included in a weight ratio of 50 to 90% by weight based on the overall weight of the composition.

Such a resin composition is easily formed into a film, and thus is readily capable of collectively encapsulating a wafer (wafer level encapsulation). Moreover, when used for encapsulating large-diameter thin-film wafers, it has an even better encapsulating ability and adhesion, further minimizes warpage, and has even better wafer protection and reliability. Hence, this resin composition is even more suitable for use in wafer-level packaging.

The resin composition can be made even more suitable for use in wafer-level packaging by additionally including an epoxy resin curing accelerator so as to further improve adhesion to the wafer and the wafer protection. The adhesion and wafer protection can also be further improved by including an epoxy resin in the composition.

The filler is preferably silica. Using silica as the filler is desirable because wafer protection can be further improved, properties such as heat resistance, moisture resistance and strength can be further enhanced, and reliability can be increased.

The invention also provides a resin film obtained by forming the above resin composition into a film.

Such a resin film has a good encapsulating ability when used to encapsulate large-diameter thin-film wafers. When collectively encapsulating a wafer, the resin does not need to be cast, and so problems such as poor filling onto the wafer surface do not arise. Also, a resin film formed using the inventive resin composition serves as a wafer encapsulating material that has good adhesion to the wafer and also provides good wafer protection.

Here, the resin film can be a composite film produced by furnishing two or more resin composition films obtained by coating a resin composition onto a release film or protective film, peeling the release film or protective film from each resin composition film, and laminating together the exposed resin composition films.

The invention further provides a method for producing a semiconductor device, which method includes the steps of encapsulating a semiconductor wafer by attaching the foregoing resin film to the semiconductor wafer; heat-curing the resin film; and singulating the encapsulated semiconductor wafer.

The semiconductor wafer thus encapsulated with the foregoing resin film incurs little warpage and is fully protected. Hence, high-quality semiconductor devices can be manufactured in a good yield by singulating the encapsulated wafer.

The invention additionally provides a semiconductor device having a heat-cured film, which device is manufactured by singulating a semiconductor wafer encapsulated with a heat-cured film obtained by heat-curing the foregoing resin film.

A semiconductor wafer encapsulated in this way with a heat-cured film obtained by heat-curing a resin film incurs little warpage and is fully protected. Such a wafer, when singulated, can yield high-quality semiconductor devices that are free of warpage.

Advantageous Effects of the Invention

The resin composition of the invention can be formed into a film, and thus has a good ability to encapsulate large-diameter thin-film wafers. Moreover, because the resulting resin film has excellent adhesion, minimizes warpage, provides excellent wafer protection and is capable of collectively encapsulating a wafer, it is well-adapted for use in wafer-level packaging.

Also, the semiconductor device of the invention and the inventive method for manufacturing such devices make it possible to provide semiconductor devices of high quality in a good yield.

DESCRIPTION OF THE PREFERRED EMBODIMENTS

The inventive resin composition, resin film (composite film) obtained from the composition, semiconductor device and method of manufacture thereof are described in detail below by way of embodiments, examples and the like. However, the invention is not limited to the following embodiments and examples, and may be practiced using any modifications thereto insofar as they do not depart from the spirit and scope of the invention.

The resin composition of the invention comprises (A) a silicone resin, (B) a phenolic compound of a specific structure, and (C) a filler.

<Resin Composition>

[(A) Silicone Resin]

In the invention, component (A) is a silicone resin which functions to impart film formability.

When the resulting resin film is used as a wafer encapsulating material, component (A) imparts adhesion to the wafer, low warpage and good moldability.

The silicone resin serving as component (A) is a silicone resin which has a weight-average molecular weight of 3,000 to 500,000 and contains repeating units of formula (1) below.

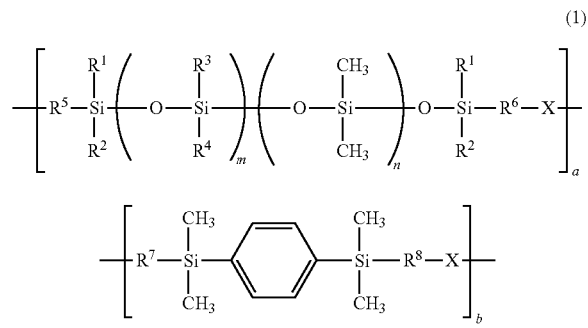

(1)

In the formula, $R^1$ to $R^4$ are each independently a monovalent hydrocarbon group of 1 to 8 carbon atoms, with the proviso that $R^3$ and $R^4$ are not both methyl; m and n are each independently an integer of 0 to 300; $R^5$ to $R^8$, which may be the same or different, are each a divalent hydrocarbon group of 1 to 10 carbon atoms; a and b are both positive numbers such that a+b=1; and X is a divalent organic moiety of general formula (2) below.

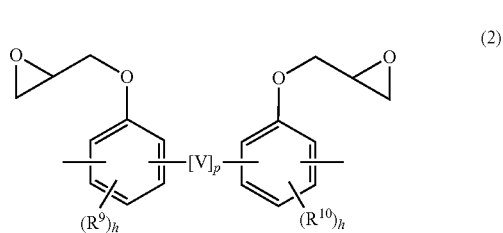

(2)

Here, V is a divalent organic group selected from the following:

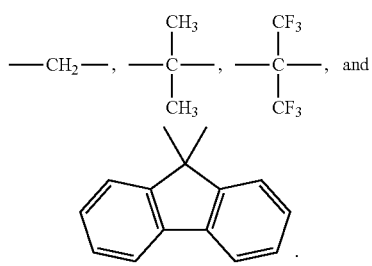

Also, p is 0 or 1; $R^9$ and $R^{10}$ are each an alkyl or alkoxy group of 1 to 4 carbons atoms and may be the same or different; and h is 0, 1 or 2.

The silicone resin of the invention is a polymer which contains repeating units of formula (1) and has a polystyrene-equivalent weight-average molecular weight, as measured by gel permeation chromatography (GPC) using tetrahydrofuran as the eluting solvent, of 3,000 to 500,000, and preferably 5,000 to 200,000. The subscripts "a" and "b" are both positive numbers, and the sum a+b=1. The respective units may be randomly bonded or may be bonded as a block polymer.

In formula (1), m and n are each independently an integer from 0 to 300. Preferably, m is from 0 to 200, especially 0 to 100; and n is from 0 to 200; and especially 0 to 100. X is a divalent organic moiety of formula (2). $R^1$ to $R^4$ are each independently a monovalent hydrocarbon group of 1 to 8 carbon atoms, preferably 1 to 6 carbon atoms, such as alkyl, cycloalkyl and aryl groups. Examples include methyl, ethyl, propyl, hexyl, cyclohexyl and phenyl groups. Of these, methyl and phenyl are preferred on account of the ready availability of the starting materials. However, $R^3$ and $R^4$ are not both methyl.

In formula (2), $R^9$ and $R^{10}$ are each independently an alkyl or alkoxy group of 1 to 4 carbon atoms, and preferably 1 or 2 carbon atoms, examples of which include methyl, ethyl, propyl, tert-butyl, methoxy and ethoxy groups. The letter "h" is 0, 1 or 2, and preferably 0.

In formula (2), V is a divalent group selected from the groups shown below, and the letter "p" is 0 or 1.

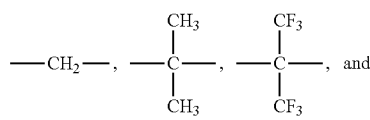

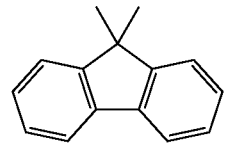

In formula (1), the subscripts "a" and "b" are positive numbers, and the sum a+b=1. It is preferable for 0.05≤a≤0.80, and more preferable for 0.10≤a≤0.70. It is preferable for 0.20≤b≤0.95, and more preferable for 0.30≤b≤0.90.

Method for Preparing Silicone Resin

The silicone resin of the invention can be prepared by the addition polymerization of compounds selected from among compounds of general formulas (3) to (6) below in the presence of a metal catalyst.

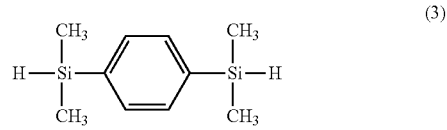

(3)

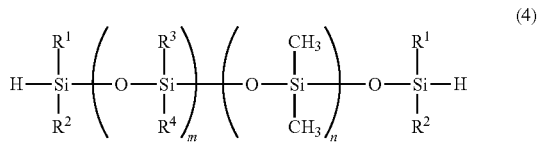

(4)

In formulas (3) and (4), $R^1$ to $R^4$ are each independently a monovalent hydrocarbon group of 1 to 8 carbon atoms, provided that $R^3$ and $R^4$ are not both methyl; and m and n are each independently an integer from 0 to 300.

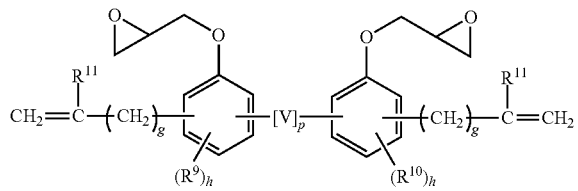

In formula (5), V is a divalent organic group selected from among the following.

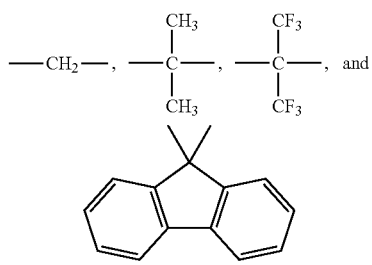

Also, p is 0 or 1, $R^9$ and $R^{10}$ are each an alkyl or alkoxy group of 1 to 4 carbon atoms and may be the same or different, h is 0, 1 or 2, $R^{11}$ is a hydrogen atom or methyl, and g is an integer from 0 to 7.

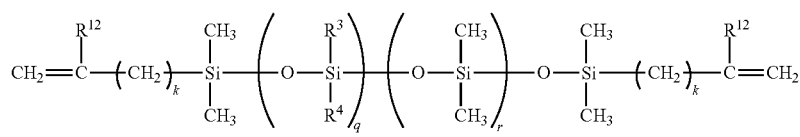

In formula (6), $R^3$ and $R^4$ are each independently a monovalent hydrocarbon group of 1 to 8 carbon atoms, provided that $R^3$ and $R^4$ are not both methyl. Also, q and r are each independently an integer from 0 to 300, $R^{12}$ is a hydrogen atom or methyl, and k is an integer from 0 to 7.

Examples of metal catalysts that may be used include uncombined platinum group metals such as platinum (including platinum black), rhodium and palladium; platinum chloride, chloroplatinic acid and chloroplatinic acid salts, such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot H_2O$ (wherein x is preferably an integer from 0 to 6, and more preferably 0 or 6); alcohol-modified chloroplatinic acid (e.g., those mentioned in U.S. Pat. No. 3,220,972); complexes of chloroplatinic acid with an olefin (e.g., those mentioned in U.S. Pat. Nos. 3,159,601, 3,159,662 and 3,775,452); catalysts consisting of platinum black or a platinum group metal such as palladium on a support such as alumina, silica or carbon; rhodium-olefin complexes; chlorotris(triphenylphosphine)rhodium (Wilkinson's catalyst); and complexes of platinum chloride, chloroplatinic acid or a chloroplatinic acid salt with a vinyl group-containing siloxane (particularly, a vinyl group-containing cyclic siloxane).

The amount of catalyst used may be the catalytic amount. In terms of the platinum group metal, an amount of 0.0001 to 0.1% by weight, especially 0.001 to 0.01% by weight, based on the overall weight of the starting compounds fed to the reaction, is preferred. The addition reaction may be carried out in the absence of a solvent, although a solvent may be used where necessary. The solvent, when used, is preferably a hydrocarbon solvent such as toluene or xylene. The reaction temperature should be a temperature at which the catalyst does not deactivate and polymerization can go to completion in a short time, such as from 40 to 150° C., and preferably 60 to 120° C. The reaction time should be suitably selected according to the type and amount of polymer. For example, a reaction of 0.5 to 100 hours, and especially 0.5 to 30 hours, is preferred. When a solvent is used, following reaction completion, the solvent is driven off by subjecting the reaction mixture to distillation at reduced pressure.

The reaction method is not particularly limited. For example, when a compound of formula (3), a compound of formula (4), a compound of formula (5) and a compound of formula (6) are reacted together, the method may consist of first mixing together and heating the compounds of formulas (5) and (6), then adding a metal catalyst to the mixture, and subsequently adding dropwise the compounds of formulas (3) and (4) over a period of 0.1 to 5 hours.

The compounds may be blended in proportions such that the ratio of the total number of moles of hydrosilyl groups on the compounds of formulas (3) and (4) to the total number of moles of alkenyl groups on compounds (5) and (6), that is, (total moles of hydrosilyl groups)/(total moles of alkenyl groups), is from 0.67 to 1.67, and preferably from 0.83 to 1.25. The weight-average molecular weight of the polymer can be controlled by using a monoallyl compound such as o-allylphenol or a monohydrosilane such as triethylhydrosilane or a monohydrosiloxane as molecular weight modifiers.

From the standpoint of film formability, encapsulating ability and low warpage, it is preferable for the amount of siloxane in the resin to be from 30 to 80% by weight.

[(B) Phenolic Compound Having Specific Structure]

Component (B) is a phenolic compound of general formula (7) below

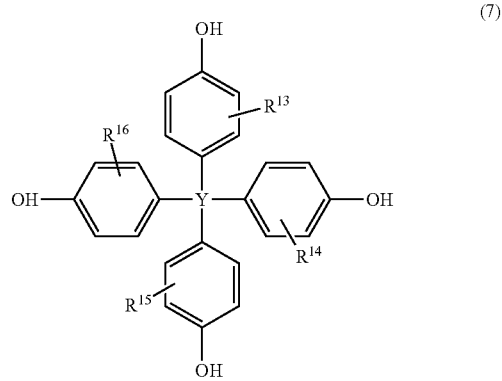

wherein Y is a carbon atom or a tetravalent hydrocarbon group of 2 to 20 carbon atoms, and $R^{13}$ to $R^{16}$ are each independently a monovalent hydrocarbon group of 1 to 8 carbon atoms or a hydrogen atom.

In formula (7), Y is a carbon atom or a tetravalent hydrocarbon group of 2 to 20 carbon atoms, with a linear or branched saturated hydrocarbon group being preferred. The structure may have thereon a cyclic hydrocarbon group or an aromatic group.

Specific examples include a carbon atom and tetravalent hydrocarbon groups selected from among the following.

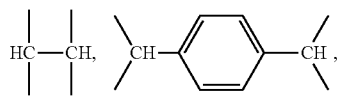

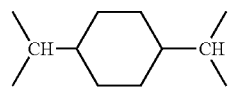

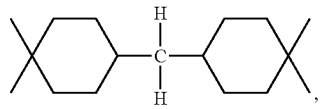

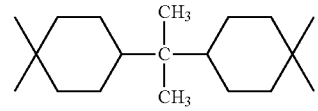

The following tetravalent hydrocarbon groups are especially preferred.

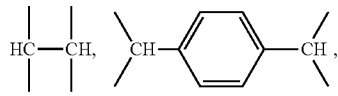

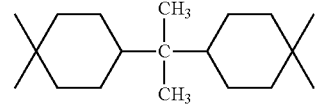

Examples of the phenolic compound of general formula (7) include, but are not limited to, the following.

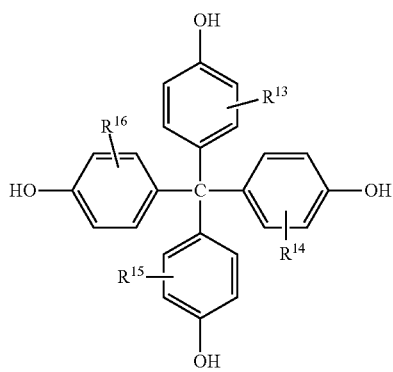

-continued

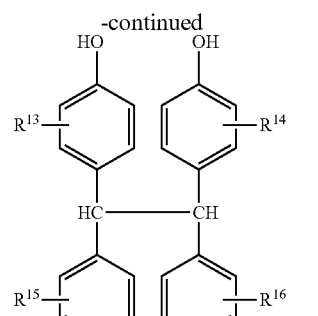

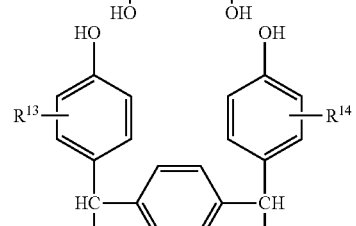

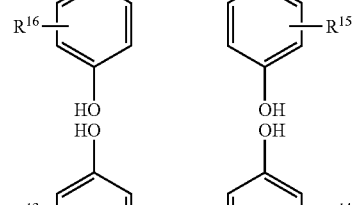

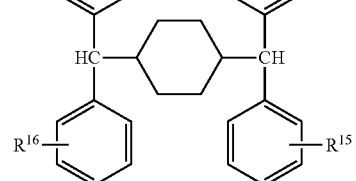

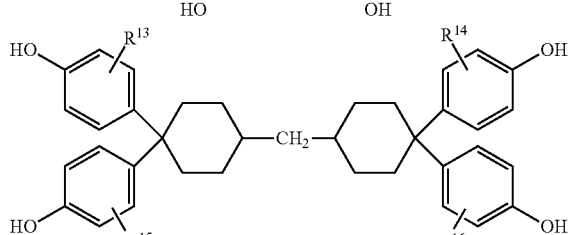

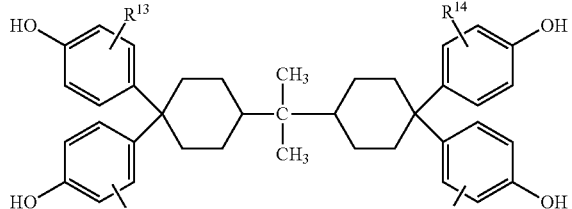

In formula (7), it is desirable to select, as each of $R^{13}$ to $R^{16}$, a hydrogen atom or an alkyl group of 1 to 3 carbon atoms.

Component (B) is an ingredient for effecting a crosslinking reaction with the silicone resin (A) under heating. By adding component (B), resin adhesion to the wafer, wafer protection and reliability are further improved. Moreover, in this invention, the phenolic compound serving as component (B) markedly lowers cure shrinkage by the inventive composition. As a result, warpage of the wafer encapsulated with the inventive compositions is dramatically reduced. The phenolic compound may be of one type used alone, or of two or more types used in combination. The OH equivalent weight in component (B) is preferably from 96 to 200.

The amount of the phenolic compound (B) included in the resin composition of the invention, although not particularly limited, is preferably 5 to 50 parts by weight, and more preferably 5 to 40 parts by weight, per 100 parts by weight of component (A). Including the phenolic compound in an amount within this range is desirable because adhesion and protection by the resin composition are further improved, in addition to which the cured form of the resin composition has an excellent reliability.

[(C) Filler]

Component (C) confers the resin composition of the invention with wafer protecting properties, in addition to which it enhances the heat resistance, moisture resistance and strength of the composition, and also increases the reliability. Exemplary fillers include silicates such as talc, fired clay, unfired clay, mica and glass; oxides such as titanium oxide, alumina, fused silica (spherical fused silica, crushed fused silica), and crystalline silica powder; carbonates such as calcium carbonate, magnesium carbonate and hydrotalcite; hydroxides such as aluminum hydroxide, magnesium hydroxide and calcium hydroxide; sulfates and sulfites such as barium sulfate, calcium sulfate and calcium sulfite; borates such as zinc borate, barium metaborate, aluminum borate, calcium borate and sodium borate; and nitrides such as aluminum nitride, boron nitride and silicon nitride. These fillers may be of one type mixed into the composition alone or may be of two or more types mixed into the composition together. Of the above fillers, silica powders such as fused silica or crystalline silica are preferred. Examples of silica powders include reinforcing silicas such as fumed silica and precipitated silica; and crystalline silicas such as quartz. Specific examples include Aerosil® R972, R974 and R976 from Nippon Aerosil Co., Ltd.; SE-2050, SC-2050, SE-1050, SO-E1, SO-C1, SO-E2, SO-C2, SO-E3, SO-C3, SO-E5 and SO-C5 from Admatechs; and Musil 120A and Musil 130A from Shin-Etsu Chemical Co., Ltd.

The average particle size of the filler, although not particularly limited, is preferably at least 0.01 μm and not more than 20 μm, and more preferably at least 0.01 μm and not more than 10 μm. An average particle size for the inorganic filler at or above this lower limit value is desirable because the inorganic filler is unlikely to agglomerate and the strength increases. On the other hand, an average particle at or below this upper limit value is desirable because resin flowability between chips increases and the filling properties are good. The average particle size can be determined with a particle size analyzer by the laser light diffraction method, and can be measured as the weight-average value $D_{50}$ (particle diameter, or median diameter, when the cumulative weight is 50%).

The filler content is preferably at least 50% by weight and not more than 90% by weight, and more preferably at least 60% by weight and not more than 85% by weight, based on the overall weight of the inventive resin composition. A filler content at or below this upper limit is desirable because film performance increases, resin flowability increases and the filling properties are good. Sufficient effects are achieved at a filler content at or above this lower limit.

Epoxy Resin

An epoxy resin may be added to the resin composition of the invention for the purpose of enhancing adhesion to the wafer and enhancing wafer protection. The epoxy resin, together with the silicone resin (A), undergoes crosslinking reactions with the phenolic resin (B), further increasing resin adhesion to the wafer, protective properties and reliability.

Examples of the epoxy resin include bisphenol A epoxy resins, bisphenol F epoxy resins, and hydrogenated forms thereof; glycidyl ether-type epoxy resins such as phenol-novolak epoxy resins and cresol-novolak epoxy resins; glycidyl ester-type epoxy resins such as the glycidyl ester of hexahydrophthalic acid and the glycidyl ester of dimer acid; and glycidyl amine-type epoxy resins such as triglycidyl isocyanurate and tetraglycidyl diaminodiphenylmethane. Preferred examples include bisphenol A epoxy resins, bisphenol F epoxy resins, phenol-novolak epoxy resins and cresol-novolak epoxy resins. These are commercially available under, for example, the following trade names: jER1001 (Mitsubishi Chemical Corporation), Epiclon® 830S (DIC Corporation), jER517 (Mitsubishi Chemical Corporation) and EOCN103S (Nippon Kayaku Co., Ltd.).

When an epoxy resin is included in the resin composition, the content of epoxy resin is typically 1 to 50 parts by weight, and preferably 2 to 30 parts by weight, per 100 parts by weight of component (A).

Epoxy Resin Curing Accelerator

The resin composition of the invention may additionally include an epoxy resin curing accelerator. Including an epoxy resin curing accelerator makes it possible to have the curing reactions proceed suitably and uniformly. The content of the epoxy resin curing accelerator is typically 0.1 to 10 parts by weight, and preferably 0.2 to 5 parts by weight, per 100 parts by weight of component (A).

Illustrative examples of the epoxy resin curing accelerator include imidazole compounds such as 2-methylimidazole, 2-ethylimidazole, 2-ethyl-4-methylimidazole and ethyl isocyanate compounds of these compounds, 2-phenylimidazole, 2-phenyl-4-methylimidazole, 2-phenyl-4-methyl-5-hydroxymethylimidazole and 2-phenyl-4,5-dihydroxymethylimidazole; DBU compounds such as 1,8-diazabicyclo[5.4.0]undecene-7 (DBU), 1,5-diazabicyclo[4.3.0]nonene-5 (DBN), organic acid salts of DBU, phenolic resin salts of DBU and tetraphenylborate salts of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate and tetraphenylphosphine-tetraphenylborate; quaternary phosphonium salts; tertiary amines such as triethyleneammonium triphenylborate; and tetraphenylboric acid salts thereof. The epoxy resin curing accelerator may be of one type used alone, or of two or more types used together.

Flame Retardant

The resin composition of the invention may include a flame retardant for the purpose of enhancing flame retardance. The flame retardant is exemplified by phosphorus-based flame retardants, and confers flame retardance without including halogen atoms. Examples include phosphazene compounds, phosphoric acid ester compounds and phosphoric acid ester amide compounds. Phosphazene compounds and phosphoric acid ester amide compounds include a phosphorus atom and a nitrogen atom on the molecule, and so provide a particularly high flame retardance. The flame retardant content is preferably 5 to 30 parts by weight per 100 parts by weight of component (A).

Silane Coupling Agent

The resin composition of the invention may include a silane coupling agent. By including a silane coupling agent, the adhesion of the resin composition to the adherend can be further increased. The silane coupling agent is exemplified by epoxy silane coupling agents and aromatic group-containing aminosilane coupling agents. These may be used singly or two or more may be used in combination. The content of silane coupling agent, although not particularly limited, is preferably at least 0.01% by weight and not more than 5% by weight of the overall weight of the resin composition of the invention.

The resin composition of the invention may also include ingredients other than those mentioned above. For example, various additives may be suitably added to increase the compatibility of the silicone resin (A) with the phenolic compound (B) having a specific structure, or to improve various properties such as the storage stability or workability of the resin composition. Illustrative examples include internal mold lubricants such as fatty acid esters, glyceric acid esters, zinc stearate and calcium stearate; and phenol, phosphorus or sulfur-based antioxidants may be added. These other optional ingredients may be added to the resin composition of the invention without solvent, or may be added following dissolution or dispersion in an organic solvent to prepare a solution or dispersion.

Organic Solvent

An organic solvent may be used as a solvent to prepare a dispersion of the resin composition. Examples of organic solvents suitable for this purpose include N,N-dimethylacetamide, methyl ethyl ketone, N,N-dimethylformamide, cyclohexanone, cyclopentanone, N-methyl-2-pyrrolidone, toluene, methanol, ethanol, isopropanol, acetone, propylene glycol monomethyl ether and propylene glycol monomethyl ether acetate. Preferred examples include methyl ethyl ketone, cyclopentanone, propylene glycol monomethyl ether and propylene glycol monomethyl ether acetate. These organic solvents may be used singly or two or more may be used together. The amount of solvent used is preferably such as to set the solids concentration of the resin composition to 50 to 80% by weight.

<Resin Film>

The resin composition of the invention is preferably formed into a film. Such a resin film has a good encapsulating ability, particularly with respect to large-diameter thin-film wafers, and obviates the need for casting a resin when collectively encapsulating a wafer.

Hence, it is possible to fundamentally eliminate problems such as wire deformation and poor filling onto the wafer surface that can arise in conventional transfer molding, and problems that can arise in compression molding, including the difficulty of controlling the molding range and difficulties associated with the flowability and other properties of the liquid encapsulating resin.

The thickness of the resin film, although not particularly limited, is preferably at least 50 µm and not more than 1,000 µm, and more preferably from 80 to 700 µm. Such a thickness is desirable because a resin film having low warpage and excellent protective properties is obtained.

Accordingly, this invention provides also a resin film formed from the foregoing resin composition. The resin film of the invention is exemplified by a resin film with protective layer composed of a resin film formed of the inventive resin composition and a protective layer covering this resin film. A protective layer such as that described subsequently in this disclosure may be used for this purpose. Exemplary methods for producing the resin film of the invention are described below.

Method for Producing Resin Film

A resin composition solution is produced in advance by mixing together and preparing into a liquid state: (A) a silicone resin, (B) a phenolic compound having a specific structure, (C) a filler and, as needed, optional ingredients and an organic solvent. The resin composition solution is coated onto a protective layer (protective film, release film) to the desired thickness using a reverse roll coater, comma coater or the like. The protective layer onto which the resin composition solution has been coated is passed through an in-line dryer and dried by removing the organic solvent at 80 to 160° C. over a period of 2 to 20 minutes, following which it is pressure-bonded and laminated with another protective layer using a roll laminator, thereby giving the resin film of the invention.

The pressure bonding conditions are not particularly limited, although it is preferable to carry out lamination at a temperature of 50 to 100° C., a linear pressure of 0.5 to 5 kgf/cm and a speed of 0.1 to 5 m/min.

In another embodiment, a compound film formed of a plurality of resin films can be obtained by furnishing two (or more) of the foregoing resin films (protective layer/resin composition film/protective layer), peeling a protective layer from each of the resin films, and laminating together both of the resin films. When lamination is carried out, the films are preferably laminated together while being heated at 30 to 120° C.

Protective Layer (Protective Film/Release Film)

The protective layer is not particularly limited, provided it can be peeled without damaging the shape of the resin film made of the inventive resin composition, and may be one that is used as a protective film and release film for wafers. Typical examples include plastic films such as polyethylene (PE) films, polypropylene (PP) films, polymethylpentene (TPX) films and polyester films that have been release treated. The peel strength is preferably 50 to 300 mN/min, and the thickness is typically 25 to 150 µm, and preferably 38 to 125 µm.

Wafer to be Encapsulated

The wafer to be collectively encapsulated with the resin film of the invention is not particularly limited, and may be a wafer having semiconductor devices (chips) stacked on the surface or a semiconductor wafer having semiconductor devices built on the surface. The resin film of the invention has good filling properties on such a wafer surface prior to encapsulation and low warpage after encapsulation, and thus provides such wafers with excellent protection. The resin film of the invention is not particularly limited, although it can be suitably used for encapsulating large-diameter wafers having a diameter of 8 inches or more, such as 8-inch (200 mm), 12-inch (300 mm) or even larger diameter wafers, and thin-film wafers.

The inventive resin film can be advantageously used on thin-film wafers that have been sliced to a thickness of 5 to 300 µm.

Wafer Encapsulation Method

The method for encapsulating a wafer using the resin film of the invention is not particularly limited. For example, encapsulation may be carried out by peeling off the protective layer attached to one side of the resin film, using a vacuum laminator manufactured by Takatori Corporation (product name: TEAM-300) to collectively bond the resin film to which the other protective layer remains attached to a wafer within a vacuum chamber set to a vacuum of 50 to 1,000 Pa, preferably 50 to 500 Pa (e.g., 100 Pa), and a temperature of 80 to 200° C., preferably 80 to 130° C. (e.g., 100° C.), returning the pressure to normal pressure and subsequently cooling the wafer to room temperature, removing the encapsulated wafer from the vacuum laminator, and peeling off the other protective layer.

Alternatively, for a wafer on which semiconductor chips have been stacked, preferred use can be made of a compression molding machine or an apparatus equipped with a vacuum diaphragm laminator and a metal plate press for planarization. For example, the apparatus manufactured by Apic Yamada Corporation under the product name MZ-824-01 may be used as the compression molding machine. A 300 mm silicon wafer having semiconductor chips stacked thereon can be molded at 100 to 180° C., a molding pressure of 100 to 300 kN, a clamping time of 30 to 90 seconds and a molding time of 5 to 20 minutes.

The system manufactured by Nichigo-Morton Co., Ltd. under the product name CVP-300 may be used as the apparatus equipped with a vacuum diaphragm laminator and a metal plate press for planarization. Following lamination at a temperature of 100 to 180° C., a vacuum of 50 to 500 Pa, a pressure of 0.1 to 0.9 PMa and a lamination time of 30 to 300 seconds, the resin molded surface may be planarized at top and bottom hot plate temperatures of 100 to 180° C., a pressure of 0.1 to 3.0 MPa, and a pressing time of 30 to 300 seconds.

After encapsulation, the resin can be cured by heating the resin film at 120 to 220° C. for 15 to 180 minutes.

<Semiconductor Device>

This invention also provides a semiconductor device having a heat-cured film thereon that is manufactured by singulating a semiconductor wafer encapsulated with a heat-cured film obtained by heat-curing the resin film. The encapsulated wafer is attached so that the encapsulated resin surface or the wafer surface is in contact with a protective tape for semiconductor machining such as dicing tape and is set in place on the chuck table of a dicer, after which the encapsulated wafer is cut using a dicing saw (such as DFD6361 from DISCO) equipped with a dicing blade. The spindle speed and cutting speed during dicing should be suitably selected, with the spindle speed generally being 25,000 to 45,000 rpm and the cutting speed generally being 10 to 50 mm/sec. The singulation size depends on the semiconductor package design, but is generally from about 2 mm×2 mm to about 30 mm×30 mm.

High-quality semiconductor devices having a good yield can be obtained by singulation using a dicing blade or the like to dice a fully protected wafer with little warpage.

Method for Manufacturing Semiconductor Device

The invention additionally provides a semiconductor device manufacturing method which includes the steps of: encapsulating a semiconductor wafer by peeling one of the protective layers from a resin film having protective layers formed on both sides, attaching the resin film on the exposed side to the semiconductor wafer, and peeling off the other protective layer from the resin film; and singulating the encapsulated semiconductor wafer.

EXAMPLES

Synthesis Examples, Working Examples of the invention and Comparative Examples are given below by way of illustration and not by way of limitation.

Synthesis Examples 1 to 3

In the Synthesis Examples, the weight-average molecular weights of the respective polymers were measured by gel permeation chromatography (GPC) using monodisperse polystyrene as the standard. A TSKgel® Super HZM-H column available from Tosoh Corporation was used as the GPC column, and the analysis conditions were as follows: flow rate, 0.6 mL/min; elution solvent, tetrahydrofuran; column temperature, 40° C.

The compounds used in the Working Examples and the Comparative Examples are shown below.

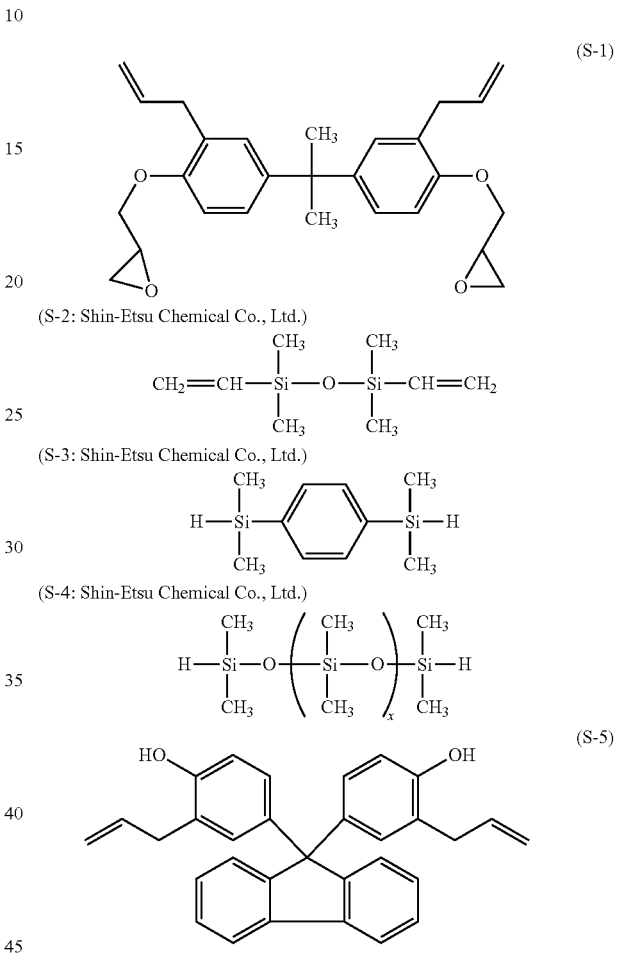

Synthesis Example 1

A 3 L flask equipped with a stirrer, a thermometer, a nitrogen purging system and a reflux condenser was charged with 147 g (0.35 mole) of the compound of formula (S-1) and 27.9 g (0.15 mole) of the compound of formula (S-2), following which 2,000 g of toluene was added. After heating the flask contents to 70° C., 1.0 g of a toluene solution of chloroplatinic acid (platinum concentration, 0.5% by weight) was added, following which 77.8 g (0.4 mole) of the compound of formula (S-3) and 276.7 g (0.1 mole) of the compound of formula (S-4) (x=40) were added dropwise over one hour (total moles of hydrosilyl groups/total moles of alkenyl groups=1/1). Following the completion of dropwise addition, the mixture was heated to 100° C. and aged 6 hours, after which toluene was removed from the reaction mixture by distillation under reduced pressure. The resulting product had a weight-average molecular weight, as measured by GPC against a polystyrene standard, of 45,000. This was furnished as Resin (1) to Working Examples of the invention and Comparative Examples. The siloxane content within Resin (1) was 58% by weight. Based on the amounts in which the reagents were charged, the repeating unit ratio in Resin (1) was a=0.2 and b=0.8.

Synthesis Example 2

A 3 L flask equipped with a stirrer, a thermometer, a nitrogen purging system and a reflux condenser was charged with 210 g (0.5 mole) of the compound of formula (S-1), following which 2,100 g of toluene was added. After heating the flask contents to 70° C., 1.0 g of a toluene solution of chloroplatinic acid (platinum concentration, 0.5% by weight) was added, following which 77.8 g (0.4 mole) of the compound of formula (S-3) and 361.9 g (0.1 mole) of the compound of formula (S-4) (x=100) were added dropwise over 2 hours (total moles of hydrosilyl groups/total moles of alkenyl groups=1/1). Following the completion of dropwise addition, the mixture was heated to 100° C. and aged 6 hours, after which toluene was removed from the reaction mixture by distillation under reduced pressure. The resulting product had a weight-average molecular weight, as measured by GPC against a polystyrene standard, of 48,000. This was furnished as Resin (2) to Working Examples of the invention. The siloxane content within Resin (1) was 69% by weight. Based on the amounts in which the reagents were charged, the repeating unit ratio in Resin (2) was a=0.2 and b=0.8.

Synthesis Example 3

A 3 L flask equipped with a stirrer, a thermometer, a nitrogen purging system and a reflux condenser was charged with 105 g (0.25 mole) of the compound of formula (S-1) and 46.5 g (0.25 mole) of the compound of formula (S-2), following which 1,000 g of toluene was added. After heating the flask contents to 70° C., 0.5 g of a toluene solution of chloroplatinic acid (platinum concentration, 0.5% by weight) was added, following which 77.8 g (0.40 mole) of the compound of formula (S-3) and 70.6 g (0.10 mole) of the compound of formula (S-4) (x=8) were added dropwise over one hour (total moles of hydrosilyl groups/total moles of alkenyl groups=1/1). Following the completion of dropwise addition, the mixture was heated to 100° C. and aged 6 hours, after which toluene was removed from the reaction mixture by distillation under reduced pressure. The resulting product had a weight-average molecular weight, as measured by GPC against a polystyrene standard, of 35,000. This was furnished as Resin (3) to Working Examples of the invention. The siloxane content within Resin (1) was 39% by weight. Based on the amounts in which the reagents were charged, the repeating unit ratio in Resin (3) is a=0.2 and b=0.8.

Comparative Synthesis Example 1

A 3 L flask equipped with a stirrer, a thermometer, a nitrogen purging system and a reflux condenser was charged with 151 g (0.35 mole) of the compound of formula (S-5) and 27.9 g (0.15 mole) of the compound of formula (S-2), following which 2,000 g of toluene was added. After heating the flask contents to 70° C., 1.0 g of a toluene solution of chloroplatinic acid (platinum concentration, 0.5% by weight) was added, following which 77.8 g (0.4 mole) of the compound of formula (S-3) and 276.7 g (0.1 mole) of the compound of formula (S-4) (x=40) were added dropwise over one hour (total moles of hydrosilyl groups/total moles of alkenyl groups=1/1). Following the completion of dropwise addition, the mixture was heated to 100° C. and aged 6 hours, after which toluene was removed from the reaction mixture by distillation under reduced pressure. The resulting product had a weight-average molecular weight, as measured by GPC against a polystyrene standard, of 38,000. This was furnished as Resin (4) to Comparative Examples. The siloxane content within Resin (4) was 57% by weight.

Working Examples 1 to 6 and Comparative Examples 1 to 3

[Preparation of Resin Composition]

The resin compositions shown in Table 1 below were prepared by blending the silicone resin (A) synthesized in Synthesis Examples 1 to 3 (Resins (1) to (3)), (B) the phenolic compound having a specific structure, (C) the filler, and optional ingredients. In each Example, cyclopentanone was added to the resin composition in an amount such as to set the concentration of the solid ingredients to 65% by weight, and a dispersion of the resin composition was prepared by agitation, mixture, dissolution and dispersion of the composition in a ball mill. The numerical values in Table 1 indicating amounts of the various ingredients blended in the compositions are in units of "parts by weight." Comparative Example 1 is a resin composition containing a silicone resin (Resin (4) above) differing from the silicone resin (A) of the invention. Comparative Example 2 is a resin composition containing a phenol-novolak resin, which is a phenolic compound outside the scope of the invention. Comparative Example 3 is a resin composition which does not include the filler (C).

[Formation of Resin Film]

Using a die coater as the film coater and using E7304 below as Release Film (1), the resin composition shown in Working Example 1 of Table 1 was coated onto the release film. The resin composition-coated release film was then passed for 5 minutes through a circulating hot-air oven (length, 4 m) set to 100° C., thereby forming a resin film having a thickness of 100 μm on Release Film (1).

Next, a polyethylene film (thickness, 100 μm) was laminated onto the resin film from above at a linear pressure of 10 N/cm and 100° C. using a laminate roller, thereby producing Laminated Film (1) consisting of Release Film (1)/resin film/protective film.

Aside from using E7302 below as Release Film (2) instead of Release Film (1), Laminated Film (2) consisting of Release Film (2)/resin film/protective film was produced in the same way as above.

In addition, a composite film consisting of Release Film (1)/resin film/Release Film (2) in which the resin film has a thickness of 200 μm was formed by removing the polyethylene film (protective film) from each of Laminated Films (1) and (2) obtained above, stacking the two resin films together and passing them in this manner through a hot roll laminator heated to 60° C.

Composite films having a resin film with a thickness of 200 μm were produced by the same method as in Working Example 1 using the other resin compositions in Table 1.

In Working Example 6, a resin film having a thickness of 500 μm was produced by the same method.

The following ingredients were used to prepare the resin compositions.

(B) Phenolic Compound Having Specific Structure

P-1 (OH equivalent weight: 114)

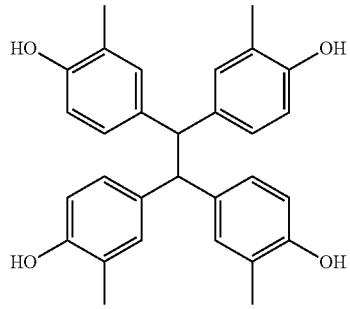

P-2 (OH equivalent weight: 119)

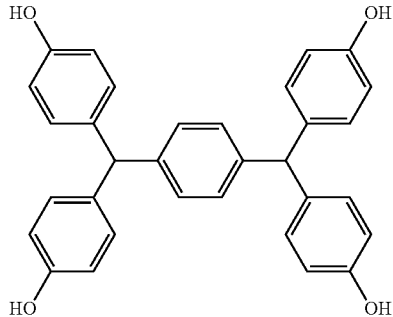

P-3 (OH equivalent weight: 144)

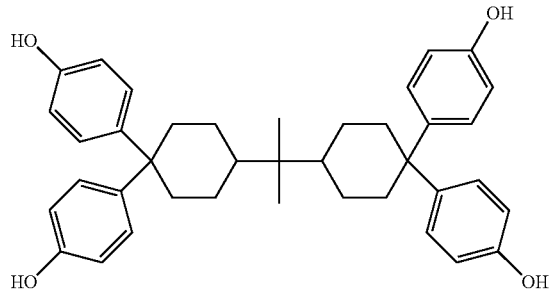

(C) Filler
Silica (from Admatechs; average particles size, 5.0 μm)
Other Ingredients

| | |
|---|---|
| EOCN-103S | (an epoxy resin available under this trade name from Nippon Kayaku Co., Ltd.; epoxy equivalent weight, 209 to 219) |
| Curezol ® 2P4MHZ | (2-phenyl-4-methyl-5-hydroxymethyl-imidazole; available from Shikoku Chemicals Corporation) |
| P-4 | (tetrafunctional phenol-novolak resin; OH equivalent weight, 117) |

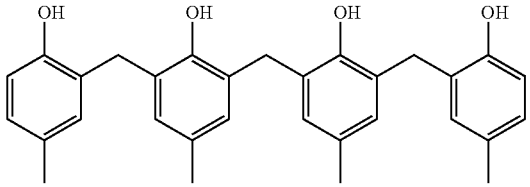 [SMILES: Cc1ccc(O)c(Cc2cc(C)cc(Cc3cc(C)cc(Cc4cc(C)ccc4O)c3O)c2O)c1]

Release Film (1): E7304 (a polyester film available under this trade name from Toyobo Co., Ltd.; thickness, 75 μm; peel strength, 200 mN/50 mm)

Release Film (2): E7302 (a polyester film available under this trade name from Toyobo Co., Ltd.; thickness, 75 μm; peel strength, 90 mN/50 mm)

Protective film: Polyethylene film (thickness, 100 μm)

TABLE 1

| Ingredients (pbw) | | Working Example | | | | | | Comparative Example | | |
|---|---|---|---|---|---|---|---|---|---|---|
| | | 1 | 2 | 3 | 4 | 5 | 6 | 1 | 2 | 3 |
| (A) Silicone resin | Resin (1) | 100 | 100 | 100 | | | 100 | | 100 | 100 |
| | Resin (2) | | | | 100 | | | | | |
| | Resin (3) | | | | | 100 | | | | |
| Silicone resin outside scope of invention | Resin (4) | | | | | | | 100 | | |
| (B) Phenolic compound | P-1 | 15 | | | 12 | | 20 | | | |
| | P-2 | | 16 | | | 20 | | | | 16 |
| | P-3 | | | 19 | | | | | | |
| Phenolic compound outside scope of invention | P-4 | | | | | | | | 15 | |
| (C) Filler | Silica | 200 | 500 | 500 | 500 | 500 | 500 | 500 | 500 | |
| Other ingredients | EOCN-103S | | | | | | | 10 | 28 | |
| | Curezol 2P4MHZ | 1 | 1 | 1 | 1 | 1 | 1 | 1 | 1 | 1 |
| Resin film thickness (μm) | | 200 | 200 | 200 | 200 | 200 | 200 | 200 | 200 | 200 |

[Lamination of Resin Film onto Wafer]

The silicon wafers having a diameter of 12 inches (300 mm) and a wafer thickness of 100 μm were furnished for use. Release Film (2) was peeled from the respective composite films obtained in Working Examples 1 to 6 and Comparative Examples 1 to 3. Using a vacuum laminator (manufactured by Takatori Corporation; product name, TEAM-300M), the interior of the vacuum chamber was set to a vacuum of 250 Pa and the resin film was collectively attached to the silicon wafer at a temperature of 110° C. The pressure was then returned to normal pressure, after which the silicon wafer was cooled to 25° C. and removed from the vacuum laminator, and the remaining Release Film (1) was peeled off.

The resulting wafer with attached resin film was heated 2 hours at 180° C. in an inert oven to cure the resin.

[Evaluation 1: Wafer Warpage]

The wafer warpage after curing of the resin film was measured with a laser (FLX-3300-T, from Tomei Technology). The results are shown in Table 2.

In cases where warpage was too large to be measured with this instrument, the value obtained by measurement using a straightedge (JIS Grade 1) is shown.

[Evaluation 2: Wafer Supportability]

The wafer supportability was evaluated by measuring the wafer deflection with a straightedge (JIS Grade 1) when one end of the wafer was supported. A deflection of 20 mm or less was rated as "good" and a deflection of more than 20 mm was rated as "NG". The results are shown in Table 2.

[Evaluation 3: Bond Strength]

The respective resin films (25 μm) were attached to 6-inch diameter semiconductor wafers (thickness, 625 μm; manufactured by Shin-Etsu Chemical Co., Ltd.) using a vacuum film laminator (TEAM-100, manufactured by Takatori Corporation; temperature, 100° C.; pressure, 100 Pa). The wafer was then cut to a size of 2 mm×2 mm square with a dicing saw (DAD685, manufactured by DISCO) equipped with a dicing blade. A 2 mm×2 mm square chip was laminated, with the resin film therebetween, onto a separately prepared 15 mm×15 mm silicon wafer (base substrate) at 150° C. and under a load of 50 mN. The resin film was then cured by 2 hours of heating at 180° C., giving a test specimen. Five test specimens for each Example were produced and then furnished to the bond strength measurement test below.

A bond tester (Dage series 4000-PXY, manufactured by Dage) was used to measure the resistance force incurred when separating the semiconductor chip (2 mm×2 mm) from the base substrate (15 mm×15 mm square silicon wafer), based on which the bond strength of the resin film layer was evaluated. Testing was carried out at a test speed of 200 μm/sec and a test height of 50 μm. The results are shown in Table 2. The numerical values shown in Table 2 are averages of the measured values obtained for five test specimens each. A higher value indicates higher bond strength by the adhesive sheet.

[Evaluation 4: Reliability]

The wafer with attached resin film after curing was cut into 10 mm×10 mm square test specimens using a dicing saw (DAD685, manufactured by DISCO; spindle speed, 40,000 rpm; cutting speed, 20 mm/sec) equipped with a dicing blade. The resulting test specimens (10 test specimens for each Example) were subjected to a heat cycling test (in which 1,000 cycles are repeated, each cycle consisting of holding the specimen at −25° C. for 10 minutes and then holding it at 125° C. for 10 minutes), and the extent of resin film delamination from the wafer following the heat cycling test was checked by ultrasonic inspection. The absence of any delamination was rated as "good" and the occurrence of delamination in one or more test piece was rated as "NG". The results are shown in Table 2.

TABLE 2

|  | Working Example | | | | | | Comparative Example | | |
| --- | --- | --- | --- | --- | --- | --- | --- | --- | --- |
| Evaluation | 1 | 2 | 3 | 4 | 5 | 6 | 1 | 2 | 3 |
| Wafer warpage (mm) | ≤1 | ≤1 | ≤1 | ≤1 | ≤1 | ≤1 | 45 | 25 | ≤1 |
| Wafer supportability | good | good | good | good | good | good | good | good | NG |
| Bond strength (MPa) | 27.4 | 29.4 | 28.4 | 28.0 | 27.8 | 30.5 | 27.8 | 25.8 | 22.0 |
| Reliability | good | good | good | good | good | good | NG | NG | NG |

As demonstrated by the above results, resin films obtained from resin compositions of the invention had a lower wafer warpage and better wafer supportability, adhesion and reliability that the resin films in the Comparative Examples.

As described above, because it is possible to form the resin compositions of the invention into films, they can be used to collectively encapsulate wafers (wafer level encapsulation) and have good encapsulating properties for use on large-diameter thin-film wafers. Resin films obtained from the resin compositions of the invention exhibited low warpage and wafer supportability, and also had excellent adhesion and reliability.

Japanese Patent Application No. 2015-089470 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resin composition comprising:

(A) a silicone resin having a weight-average molecular weight of 3,000 to 500,000 and containing repeating units of formula (1) below

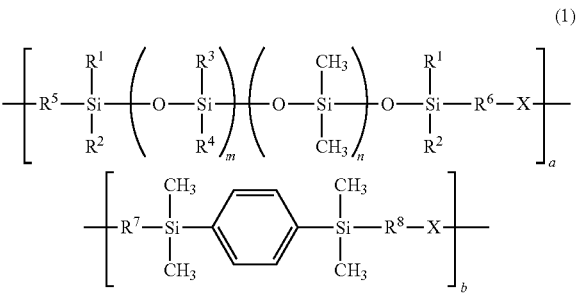

wherein $R^1$ to $R^4$ are each independently a monovalent hydrocarbon group of 1 to 8 carbon atoms, with the proviso that $R^3$ and $R^4$ are not both methyl, m and n are each independently an integer of 0 to 300, $R^5$ to $R^8$, which may be the same or different, are each a divalent hydrocarbon group of 1 to 10 carbon atoms, a and b are both positive numbers such that a+b=1, and X is a divalent organic moiety of general formula (2) below

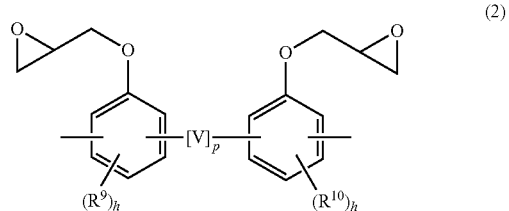

wherein V is a divalent organic group selected from the following:

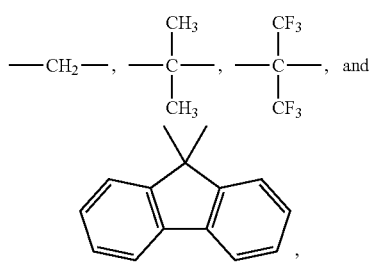

p is 0 or 1,
R$^9$ and R$^{10}$ are each an alkyl or alkoxy group of 1 to 4 carbons atoms and may be the same or different, and
h is 0, 1 or 2;

(B) a phenolic compound of general formula (7) below

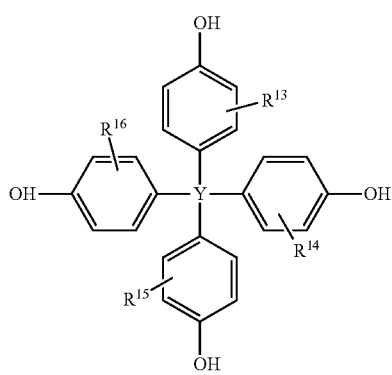

(7)

wherein Y is a carbon atom or a tetravalent hydrocarbon group of 2 to 20 carbon atoms, and
R$^{13}$ to R$^{16}$ are each independently a monovalent hydrocarbon group of 1 to 8 carbon atoms or a hydrogen atom; and (C) a filler, wherein a content of the filler is at least 79% by weight and not more than 90% by weight based on an overall weight of the resin composition.

2. The resin composition of claim 1 wherein Y in formula (7) is a carbon atom or a tetravalent hydrocarbon group selected from the following:

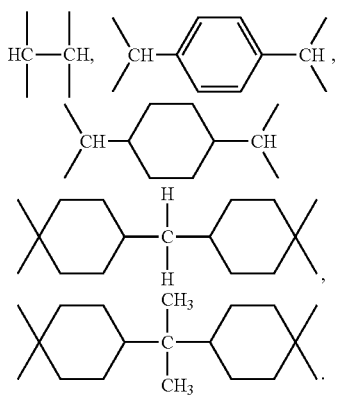

3. The resin composition of claim 1, wherein component (B) is included in an amount of 5 to 50 parts by weight per 100 parts by weight of component (A).

4. The resin composition of claim 1 which further comprises an epoxy resin.

5. The resin composition of claim 1 which further comprises an epoxy resin curing accelerator.

6. The resin composition of claim 1, wherein the filler is silica.

7. A resin film obtained by forming the resin composition of claim 1 into a film.

8. A method for manufacturing a semiconductor device, comprising the steps of:
encapsulating a semiconductor wafer by attaching the resin film of claim 7 to the semiconductor wafer;
heat-curing the resin film; and
singulating the encapsulated semiconductor wafer.

9. A semiconductor device having a heat-cured film, which device is obtained by singulating a semiconductor wafer encapsulated by a heat-cured film obtained by heat-curing the resin film of claim 7.

10. The resin composition of claim 2, wherein Y in formula (7) is a carbon atom or a tetravalent hydrocarbon group selected from the following:

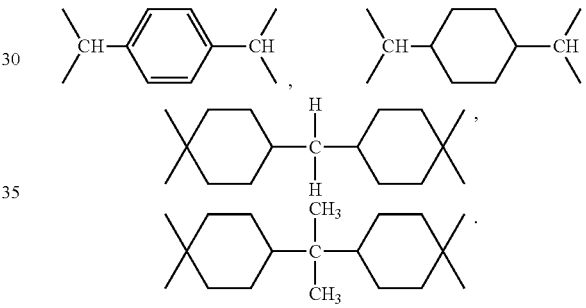

11. The resin composition of claim 10, wherein Y in formula (7) is a carbon atom or a tetravalent hydrocarbon group selected from the following:

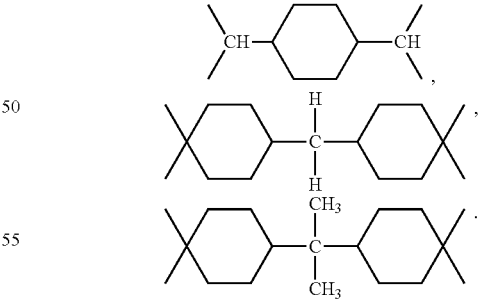

12. The resin composition of claim 1, wherein Y is a carbon atom or a tetravalent hydrocarbon group of 3 to 20 carbon atoms having a cyclic hydrocarbon group or an aromatic group thereon.

* * * * *